US012785043B2

(12) United States Patent
Chen et al.

(10) Patent No.: US 12,785,043 B2
(45) Date of Patent: Nov. 3, 2026

(54) PHOTOELECTRON ASSISTED PLASMA IGNITION

(71) Applicant: LAM RESEARCH CORPORATION, Fremont, CA (US)

(72) Inventors: Lee Chen, Cedar Creek, TX (US); Ramesh Chandrasekharan, Portland, OR (US); Shaun Tyler Smith, Portland, OR (US); Yukinori Sakiyama, West Linn, OR (US); Aaron Durbin, Portland, OR (US); Jon Henri, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 943 days.

(21) Appl. No.: 17/928,426

(22) PCT Filed: May 21, 2021

(86) PCT No.: PCT/US2021/033524
§ 371 (c)(1),
(2) Date: Nov. 29, 2022

(87) PCT Pub. No.: WO2021/247249
PCT Pub. Date: Dec. 9, 2021

(65) Prior Publication Data

US 2023/0207274 A1 Jun. 29, 2023

Related U.S. Application Data

(60) Provisional application No. 63/033,507, filed on Jun. 2, 2020.

(51) Int. Cl.
*H01J 37/32* (2006.01)

(52) U.S. Cl.
CPC .. *H01J 37/32339* (2013.01); *H01J 37/32091* (2013.01); *H01J 37/32119* (2013.01);
(Continued)

(58) Field of Classification Search
CPC .......... H01J 37/32091; H01J 37/32119; H01J 37/32339; H01J 2237/334; H01J 2237/3321; H01J 2237/327
See application file for complete search history.

(56) References Cited

U.S. PATENT DOCUMENTS

| | | | | |
|---|---|---|---|---|
| 5,622,595 A | | 4/1997 | Gupta et al. | |
| 5,935,334 A | * | 8/1999 | Fong ................ | H01J 37/32192 257/E21.243 |

(Continued)

FOREIGN PATENT DOCUMENTS

| | | |
|---|---|---|
| CN | 101146741 A | 3/2008 |
| CN | 102144275 A | 8/2011 |

(Continued)

OTHER PUBLICATIONS

Korean Office Action for Korean Application No. 10-2022-7044382 dated May 27, 2025.

(Continued)

*Primary Examiner* — Yuechuan Yu

(57) ABSTRACT

A substrate processing system includes a gas source, an RF source, and a light source. The gas source supplies a first gas to a process module of the substrate processing system. The RF source supplies RF power to the process module to generate plasma when the first gas is supplied to the process module of the substrate processing system. The light source is coupled to the process module to introduce light into the process module during the plasma generation.

19 Claims, 6 Drawing Sheets

(52) U.S. Cl.
CPC . *H01J 2237/327* (2013.01); *H01J 2237/3321* (2013.01); *H01J 2237/334* (2013.01)

(56) References Cited

U.S. PATENT DOCUMENTS

| | | | | |
|---|---|---|---|---|
| 6,514,376 | B1 * | 2/2003 | Collins | H01J 37/32165 118/724 |
| 2004/0118834 | A1 | 6/2004 | Ohmi et al. | |
| 2009/0078871 | A1 * | 3/2009 | Walther | H01L 21/67253 250/356.1 |
| 2010/0131226 | A1 * | 5/2010 | Takizawa | H01J 37/32926 374/161 |
| 2010/0206482 | A1 * | 8/2010 | Matsudo | G01J 5/0879 118/712 |
| 2015/0096683 | A1 | 4/2015 | Deshmukh et al. | |
| 2015/0168130 | A1 * | 6/2015 | Matsudo | G01B 9/02021 374/161 |
| 2016/0042943 | A1 | 2/2016 | Ribaudo et al. | |
| 2019/0385862 | A1 * | 12/2019 | Yang | H01L 21/67063 |
| 2021/0050213 | A1 * | 2/2021 | Savas | H01J 37/321 |

FOREIGN PATENT DOCUMENTS

| | | | | |
|---|---|---|---|---|
| CN | 107109645 | A | | 8/2017 |
| CN | 110600356 | A | | 12/2019 |
| JP | 2002110636 | A | * | 4/2002 |
| JP | 2016180178 | A | | 10/2016 |
| KR | 1019950024257 | | | 8/1995 |
| KR | 1020020064028 | A | | 8/2002 |
| KR | 100377095 | B1 | | 3/2003 |
| KR | 20200011342 | A | | 2/2020 |
| TW | 201719753 | A | | 6/2017 |

OTHER PUBLICATIONS

Taiwanese Office Action for Taiwanese Application No. 110119402 dated Mar. 4, 2025.

International Search Report and Written Opinion of the ISA issued in PCT/US2021/033524, mailed Sep. 9, 2021; ISA/KR.

* cited by examiner

PHOTOELECTRON ASSISTED PLASMA IGNITION

CROSS-REFERENCE TO RELATED APPLICATIONS

This application is a U.S. National Phase Application under 35 U.S.C. 371 of International Application No. PCT/US2021/033524, filed on May 21, 2021, which claims the benefit of U.S. Provisional Application No. 63/033,507, filed on Jun. 2, 2020. The entire disclosures of the applications referenced above are incorporated herein by reference.

FIELD

The present disclosure relates generally to substrate processing systems and more particularly to photoelectron assisted plasma ignition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD), a chemically enhanced plasma vapor deposition (CEPVD), a sputtering physical vapor deposition (PVD), atomic layer deposition (ALD), and plasma enhanced ALD (PEALD). Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. A computer-controlled robot typically transfers substrates from one processing chamber to another in a sequence in which the substrates are to be processed. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. The processing chambers are periodically cleaned by supplying a cleaning gas into the processing chamber and striking plasma.

SUMMARY

A substrate processing system comprises a gas source, an RF source, and a light source. The gas source supplies a first gas to a process module of the substrate processing system. The RF source supplies RF power to the process module to generate plasma when the first gas is supplied to the process module of the substrate processing system. The light source is coupled to the process module to introduce light into the process module during the plasma generation.

In another feature, the light source is coupled to the process module to introduce light into the process module synchronously with the supply of the RF power to the process module during the plasma generation.

In another feature, the substrate processing system further comprises a controller to control the RF source and the light source and to synchronize the introduction of the light from the light source into the process module with the supply of the RF power from the RF source to the process module during the plasma generation.

In another feature, the light includes only ultraviolet light.

In another feature, the light includes only visible light.

In other features, the light has a first wavelength, and the substrate processing system further comprises a second light source to introduce light having a second wavelength into the process module synchronously with the supply of the RF power during the plasma generation.

In another feature, the substrate processing system further comprises a controller to select the second light source in response to the gas source supplying a second gas to the process module instead of the first gas.

In other features, the light source is configured to output light having different wavelengths, and the substrate processing system further comprises a controller to select a wavelength of the light output by the light source based on the first gas.

In another feature, the process module is configured to generate inductively coupled plasma or a capacitively coupled plasma.

In another feature, the light source is external to the process module and is arranged proximate to a viewing port of the process module.

In another feature, the light source is arranged inside the process module.

In another feature, the light source is encapsulated with a material other than glass.

In another feature, the process module includes a dielectric window, and the light source includes light emitting diodes disposed in the dielectric window.

In another feature, the light emitting diodes output ultraviolet light.

In another feature, the light emitting diodes output visible light.

In another feature, the light emitting diodes output light having different wavelengths.

In another feature, the substrate processing system further comprises a controller to turn the light emitting diodes on and off individually.

In another feature, the substrate processing system further comprises a controller to turn the light emitting diodes on and off in a pattern.

In another feature, the substrate processing system further comprises a controller to control wavelengths of light output by the light emitting diodes individually.

In another feature, the light source is external to the process module, and the light from the light source is introduced into the process module using optical fibers.

In another feature, the process module includes a showerhead, and the optical fibers are routed through the showerhead.

In other features, the process module includes a dielectric window, a gas injector arranged therein, and the optical fibers are routed through the gas injector.

In other features, the process module includes a pedestal, and the optical fibers are routed from under the process module at a location outside the perimeter of the pedestal.

In another feature, the first gas includes a precursor gas, a process gas, or a cleaning gas.

In another feature, the substrate processing system further comprises a controller to control the light source to introduce the light in the form of light pulses into the process module during the plasma generation.

In another feature, the controller selects at least one of a pulse width and a pulse repetition rate based on the first gas.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
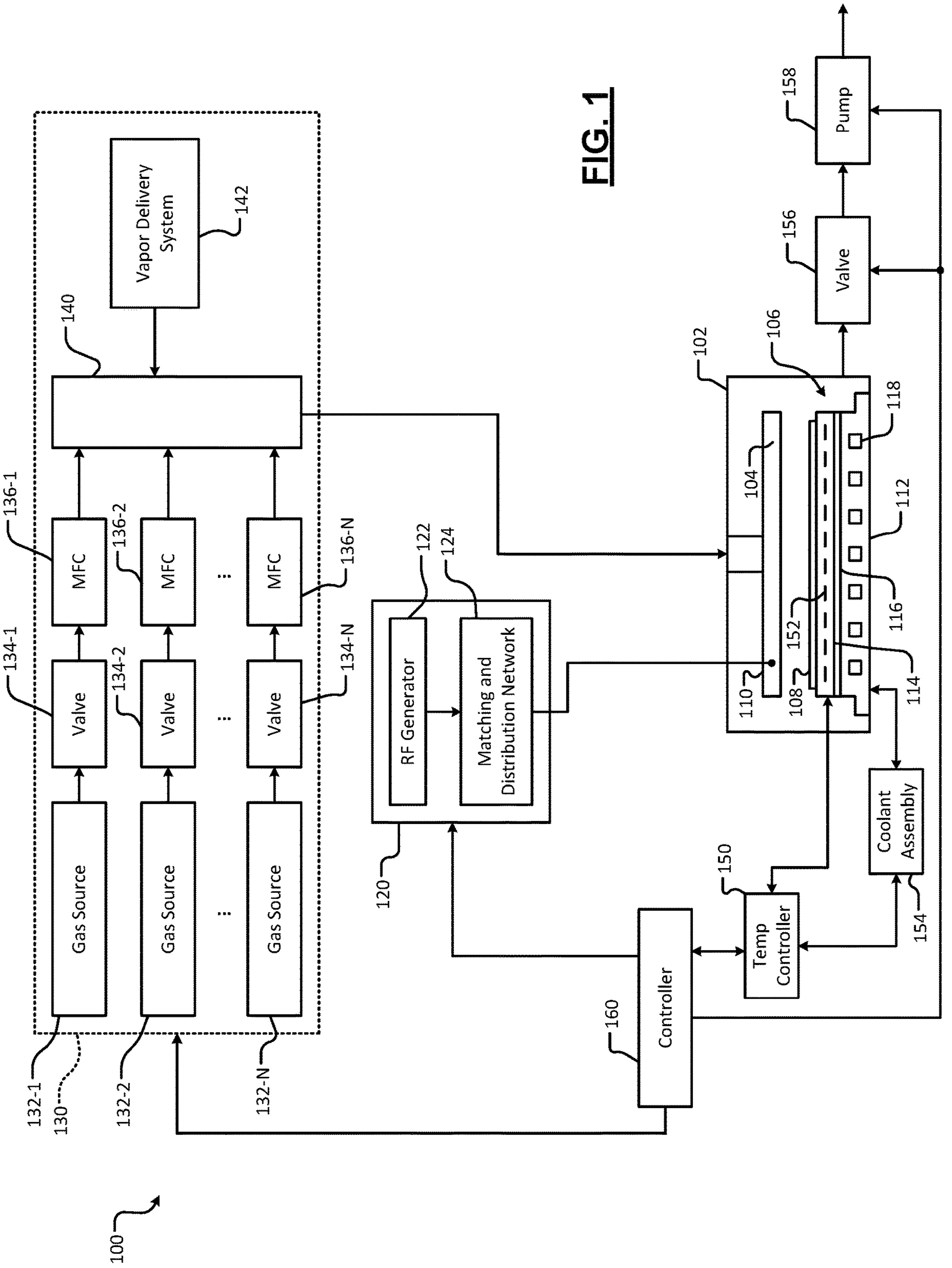
FIG. 1 shows an example of a substrate processing system.

Electronegative species generated during substrate processing are adsorbed on outer surfaces of internal components (e.g., inner walls, pedestals, etc.) of process modules. The internal components of the process modules act as electron sinks. The adsorption of the electronegative species on the internal components of the process modules adversely affects electron economy in early discharge environment of plasma generation, which causes an ignition delay during plasma generation. Consequently, ignition time for plasma is on order of seconds for both capacitively coupled plasma (CCP) and inductively coupled plasma (ICP). The ignition time for inductively coupled plasma is greater than that for capacitively coupled plasma. The ignition time can be reduced using a spark plug/high voltage to aid plasma ignition. However, high voltages can cause sputtering and other problematic outcomes on semiconductor wafers.

The present disclosure couples a light source to a process module to introduce light (e.g., UV and/or visible light) into the interior of the process module. The light source is controlled to output the light synchronously with RF power supplied by an RF source to generate plasma. For example, the light source can be turned on just before, at the same time, or shortly after RF power is supplied to the process module. For example, the light source can be turned off after a short period while the RF power is still being supplied to the process module. For example, the light source can be turned off at the same time or after the RF power supply to the process module is terminated. For example, the light source can be kept turned on throughout the process performed in the process module.

When the light from the light source is incident on an internal component of the process module, the incident light causes photoionization of negative ions adsorbed in an outer surface of the internal component. The photoionization is not limited to the adsorbed negative ions. The incident light can also cause photoionization of metal molecules in the outer surfaces of the internal components of the process modules. Due to the photoionization, photoelectrons are ejected from the outer surfaces of the internal components of the process modules. These ejected photoelectrons impinge upon molecules and ions of process gases that are being excited by the RF power to generate plasma, which accelerates plasma generation. Further, the light source (or light sources) can be pulsed to eject photoelectrons in bursts (offering a much higher current) to ignite the plasma. Thus, the photoelectrons assist in plasma generation and reduce ignition time during plasma generation.

The light source can be used not only when plasma is generated for substrate processing (e.g., during deposition and etching) but also when plasma is generated for chamber cleaning. The wavelength of the light output by the light source can be selected based on the gas or gases (i.e., chemistries) used to generate the plasma during deposition, etching, and cleaning processes performed in the process modules. For example, UV light is used when precursor gases including iodine or halogens are used during deposition or etching. Visible light may also be used. In some implementations, a single light source capable of generating light of different wavelengths can be used. In some applications, more than one light source may be used, where each light source can output light of a different wavelength. The light source (or light sources) can be turned on and off in various ways, as described below in detail.

The light source can be arranged in one of many locations outside or inside the process module. In some examples, the light source is encapsulated with a material (e.g., quartz) that is transparent to UV or other wavelengths of light output by the light source. Glass is not used to encapsulate a UV light source since glass blocks UV. Using material such as quartz to encapsulate the light source protects the light source from process chemistries. Further, if the light source is arranged inside the process module (e.g., when the process module does not include a window or a viewing port), the light source can be positioned/located in the process module such that any coating formed on the material encapsulating the light source during deposition and/or etch processes can be purged during a purge process performed in the process module. These and other features of the present disclosure are described below in detail.

The present disclosure is organized as follows. First, to illustrate wide applicability of the teachings of the present disclosure, examples of processing chambers are shown and described with reference to FIGS. 1-2. Thereafter, various locations for arranging the light source external and internal to the processing chambers are schematically shown and described with reference to FIGS. 3A-5. A method of photoelectron assisted plasma ignition according to the present disclosure is shown and described with reference to FIG. 6.

FIG. 1 shows an example of a substrate processing system 100 comprising a processing chamber 102 configured to generate capacitively coupled plasma. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching. The substrate processing system 100 comprises the processing chamber 102 that encloses other components of the substrate processing system 100 and contains RF plasma (if used). The processing chamber 102 comprises an upper electrode 104 and an electrostatic chuck (ESC) 106 or other type of substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, cleaning gas or purge gas flows. Alternately, the upper electrode 104 may include a conducting plate, and the gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system (or an RF source) 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example, the RF generating system 120 may include an RF generator 122 that generates RF power that is fed by a matching and distribution network 124 to the upper electrode 104 or the baseplate 112. In other examples, while not shown, the plasma may be generated inductively or remotely and then supplied to the processing chamber 102.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102. The gas sources 132 may supply process gases, cleaning gases or purge gases.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the substrate processing system 100.

Figure 2:
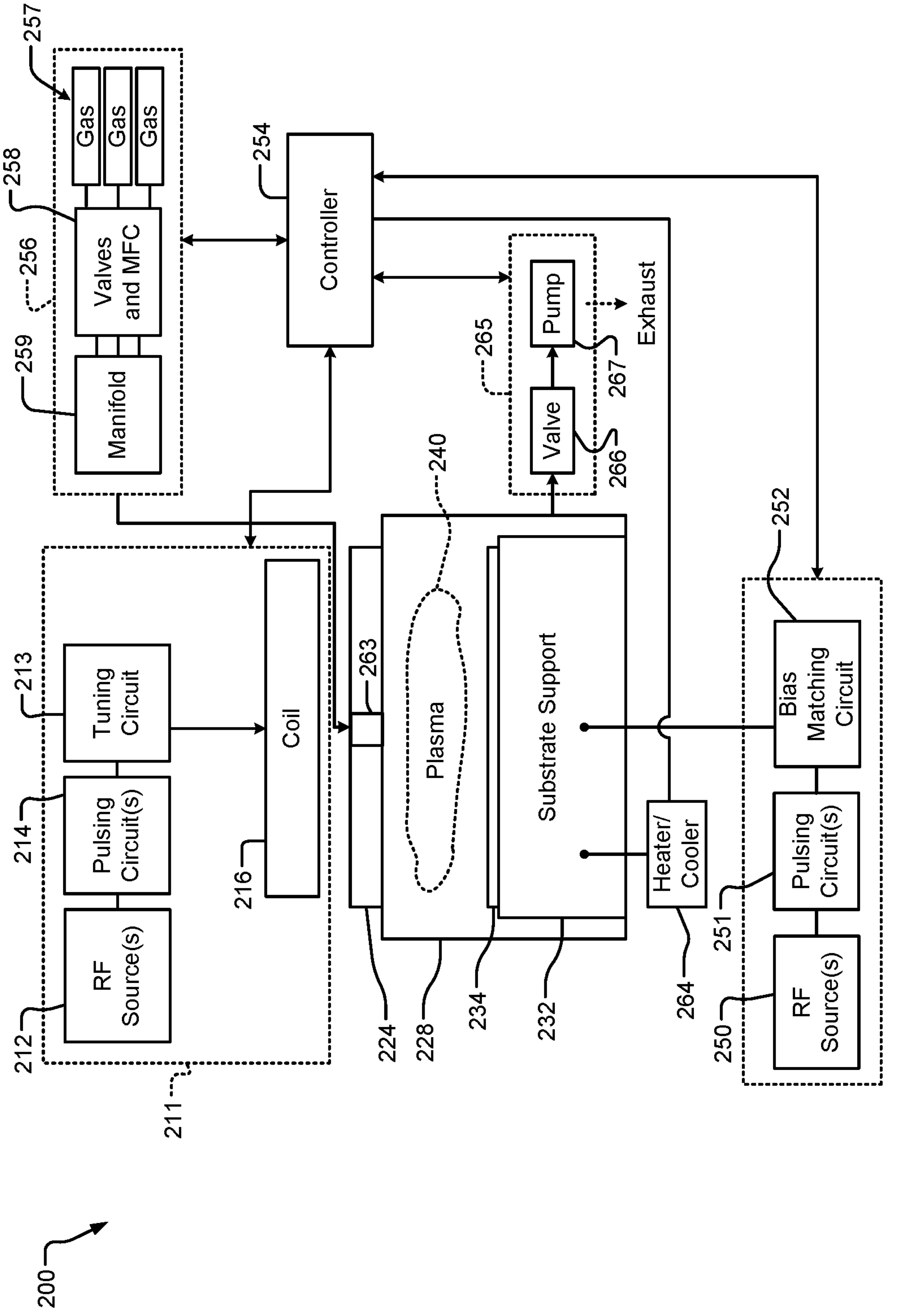
FIG. 2 shows another example of a substrate processing system.

FIG. 2 shows another example of a substrate processing system 200 configured to generate inductively coupled plasma. The substrate processing system 200 includes a coil driving circuit 211. In some examples, the coil driving circuit 211 includes an RF source 212, a pulsing circuit 214, and a tuning circuit (i.e., matching circuit) 213. The pulsing circuit 214 controls a transformer coupled plasma (TCP) envelope of an RF signal generated by the RF source 212 and varies a duty cycle of TCP envelope between 1% and 99% during operation. As can be appreciated, the pulsing circuit 214 and the RF source 212 can be combined or separate.

The tuning circuit 213 may be directly connected to an inductive coil 216. While the substrate processing system 210 uses a single coil, some substrate processing systems may use a plurality of coils (e.g., inner and outer coils). The tuning circuit 213 tunes an output of the RF source 212 to a desired frequency and/or a desired phase, and matches an impedance of the coil 216.

A dielectric window 224 is arranged along a top side of a processing chamber 228. The processing chamber 228 comprises a substrate support (or pedestal) 232 to support a substrate 234. The substrate support 232 may include an electrostatic chuck (ESC), or a mechanical chuck or other type of chuck. Process gas is supplied to the processing chamber 228 and plasma 240 is generated inside of the processing chamber 228. The plasma 240 etches an exposed surface of the substrate 234. An RF source 250, a pulsing circuit 251, and a bias matching circuit 252 may be used to bias the substrate support 232 during operation to control ion energy.

A gas delivery system 256 may be used to supply a process gas mixture to the processing chamber 228. The gas delivery system 256 may include process and inert gas sources 257, a gas metering system 258 such as valves and mass flow controllers, and a manifold 259. A gas injector 263 may be arranged at a center of the dielectric window 224 and is used to inject gas mixtures from the gas delivery system 256 into the processing chamber 228. Additionally or alternatively, the gas mixtures may be injected from the side of the processing chamber 228.

A heater/cooler 264 may be used to heat/cool the substrate support 232 to a predetermined temperature. An exhaust system 265 includes a valve 266 and pump 267 to control pressure in the processing chamber and/or to remove reactants from the processing chamber 228 by purging or evacuation.

A controller 254 may be used to control the etching process. The controller 254 monitors system parameters and controls delivery of the gas mixture; striking, maintaining, and extinguishing the plasma; removal of reactants; supply of cooling gas; and so on. Additionally, as described below, the controller 254 may control various aspects of the coil driving circuit 210, the RF source 250, and the bias matching circuit 252, and so on.

Figure 3B:
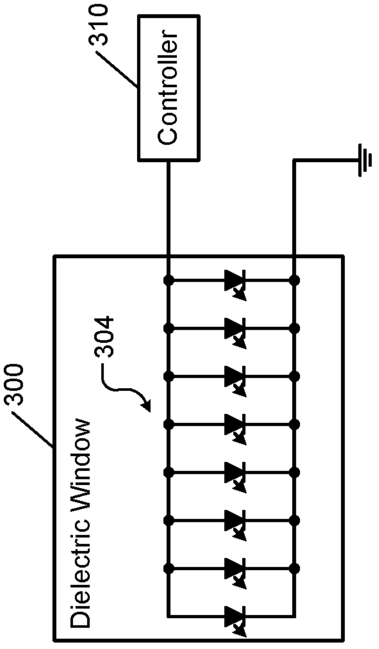
FIGS. 3A-3C show examples of arranging light emitting diodes (LEDs) in a dielectric window of a process module according to the present disclosure.
Figure 3C:
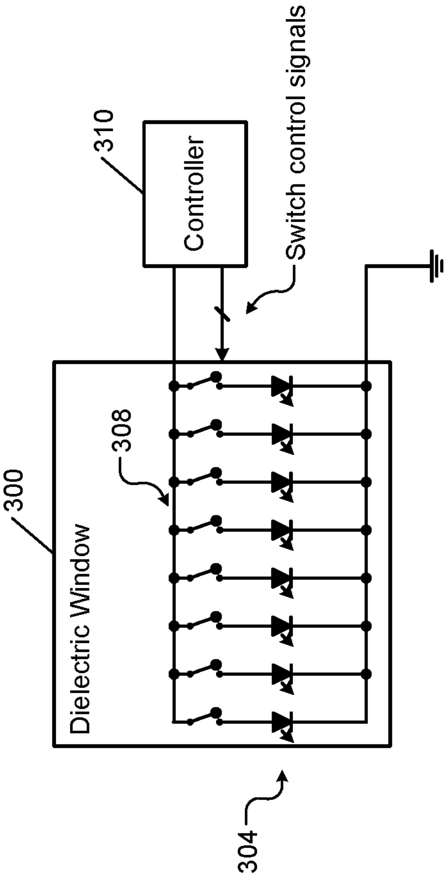
Figure 3A:
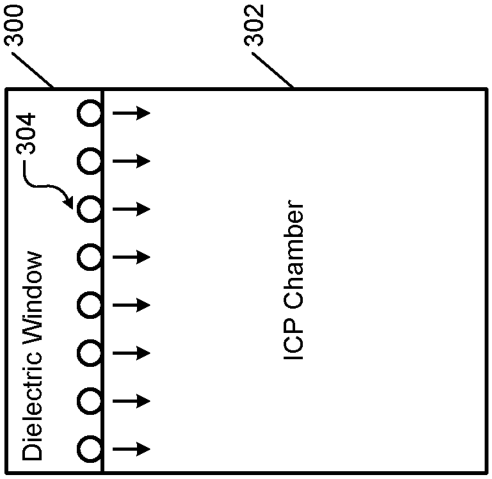

FIGS. 3A-3C schematically show a light source arranged in a dielectric window 300 of an ICP chamber 302 (e.g., the dielectric window 224 of the processing chamber 228 shown in FIG. 2). For example, in FIG. 3A, the light source including a plurality of LEDs generally shown at 304 is arranged in the dielectric window 300 of the ICP chamber 302. The LEDs 304 are arranged proximate to a plasma facing side of the dielectric window 300 to introduce light from the LEDs 304 into the ICP chamber 302.

In FIG. 3B, the LEDs 304 are controlled by a controller 310 (e.g., the controller 254 shown in FIG. 2). The controller 310 controls an RF source (e.g., the RF sources 212 shown in FIG. 2) that supply RF power to the ICP chamber 302 and controls the LEDs 304 synchronously with the RF power supplied by the RF source to the ICP chamber 302. For example, the controller 310 can turn on the LEDs 304 just before, at the same time, or shortly after the RF power is supplied to the ICP chamber 302. For example, the controller 310 can turn off the LEDs 304 after a short period while the RF power is still being supplied to the ICP chamber 302. For example, the controller 310 can turn off the LEDs 304 at the same time or after the RF power supply to the ICP chamber 302 is terminated. In some examples, the controller 310 may keep all or some of the LEDs 304 turned on throughout the processing performed in the ICP chamber 302 as explained below in further detail.

For example, the LEDs 304 may output only ultraviolet light. In some examples, the LEDs 304 may output visible light. In other examples, the LEDs 304 may output light of different wavelengths. For example, a first set of LEDs from the LEDs 304 may output light having a first wavelength while a second set of LEDs from the LEDs 304 may output light having a second wavelength. In some examples, the LEDs 304 may output both UV and visible light into the ICP chamber 302. Both sets of LEDs may be controlled in the same or different way as explained below in further detail.

In FIG. 3C, the controller 310 may control the LEDs 304 via switches generally shown at 308. By controlling the switches 308, the controller 310 can turn each of the LEDs 304 on and off individually. The controller 310 can also control the duty cycle (i.e., on/off times) of each of the LEDs 304 individually. The controller 310 can also turn all or some of the LEDs 304 on or off at the same time. The controller 310 can also turn the LEDs 304 on/off in a pattern (e.g., turn on only outer LEDs during one RF period, turn on only inner LEDs during another RF period, and so on).

In some examples, depending on the type of processing being performed in the ICP chamber 302, from the LEDs 304, a first set of LEDs outputting light of a first wavelength may be kept turned on throughout the processing performed in the ICP chamber 302, while a second set of LEDs outputting light of a second wavelength may be turned on just before, at the same time, or shortly after the RF power is supplied to the ICP chamber 302 as follows.

For example, the second set of LEDs may be turned on just before the RF power is supplied to the ICP chamber 302 and may be turned off before the RF power supply to the ICP chamber 302 is terminated. In some examples, the second set of LEDs may be turned on just before the RF power is supplied and may be turned off when the RF power is terminated. In some examples, the second set of LEDs may be turned on just before the RF power is supplied and may be turned off after the RF power is terminated.

In some examples, the second set of LEDs may be turned on when the RF power is supplied and may be turned off before the RF power is terminated. In some examples, the second set of LEDs may be turned on when the RF power is supplied and may be turned off when the RF power is terminated. In some examples, the second set of LEDs may be turned on when the RF power is supplied and may be turned off after the RF power is terminated.

In some examples, the second set of LEDs may be turned on after the RF power is supplied and may be turned off before the RF power is terminated. In some examples, the second set of LEDs may be turned on after the RF power is supplied and may be turned off when the RF power is terminated. In some examples, the second set of LEDs may be turned on after the RF power is supplied and may be turned off after the RF power is terminated.

In some examples, all of the LEDs 304 may be turned on and off using similar timing sequences. In some examples, instead of keeping the first set of LEDs turned on throughout the processing and switching or controlling the second set of LEDs as described above, both sets of LEDs may be turned on and off as follows.

For example, both sets of LEDs may be turned on just before the RF power is supplied. In this example, both sets of LEDs may be turned off before, at the same time, or after the RF power is terminated. Alternatively, in this example, one of the two sets of LEDs may be turned off before the RF power is terminated while the other of the two sets of LEDs may be turned off when the RF power is terminated. Alternatively, in this example, one of the two sets of LEDs may be turned off before the RF power is terminated while the other of the two sets of LEDs may be turned off after the RF power is terminated.

For example, the first set of LEDs may be turned on just before the RF power is supplied while the second set of LEDs may be turned on when the RF power is supplied. In this example, both sets of LEDs may be turned off before, at the same time, or after the RF power is terminated. Alternatively, in this example, the first set of LEDs may be turned off before the RF power is terminated while the second set of LEDs may be turned off when the RF power is terminated. Alternatively, in this example, the first set of LEDs may be turned off before the RF power is terminated while the second set of LEDs may be turned off after the RF power is terminated.

For example, the first set of LEDs may be turned on when the RF power is supplied while the second set of LEDs may be turned on after the RF power is supplied. In this example, both sets of LEDs may be turned off before, at the same time, or after the RF power is terminated. Alternatively, in this example, the first set of LEDs may be turned off before the RF power is terminated while the second set of LEDs may be turned off when the RF power is terminated. Alternatively, in this example, the first set of LEDs may be turned off before the RF power is terminated while the second set of LEDs may be turned off after the RF power is terminated.

The light from the LEDs 304 incident on the internal components of the ICP chamber 302 causes photoionization of negative ions adsorbed in outer surfaces of the internal components of the ICP chamber 302 during processes performed in the ICP chamber 302. The incident light can also cause photoionization of metal molecules in the outer surfaces of the internal components of the ICP chamber 302. As a result, photoelectrons are ejected from the outer surface of the internal components of the ICP chamber 302. These ejected photoelectrons impinge upon molecules and ions of gases that are being excited by the RF power to generate plasma, which accelerates plasma generation and reduces ignition time during plasma generation in the ICP chamber 302.

FIGS. 4A-4D schematically show various ways of arranging a light source external to a process module. For example, in FIG. 4A, an ICP or CCP chamber 350 (such as the processing chambers 228 and 102 shown in FIGS. 1-2) may include a window or a viewing port 352 (e.g., in a wall of the chamber 350). A light source 354 may be arranged outside the chamber 350 and proximate to the viewing port 352 of the chamber 350.

A controller 356 (e.g., the controller 160 or 254 shown in FIGS. 1-2) may control the light source 354. The controller 356 controls an RF source (e.g., the RF generator 122 and the RF sources 212 shown in FIGS. 1-2) that supplies RF power to the chamber 350 and controls the light source 354 synchronously with the RF power supplied by the RF source to the chamber 350. For example, the light source 354 may output only UV light. In some examples, the light source 354 may output visible light. In other examples, the light source 354 may output light of different wavelengths, and the controller 356 may control the wavelength of the light output by the light source 354.

Figure 5:
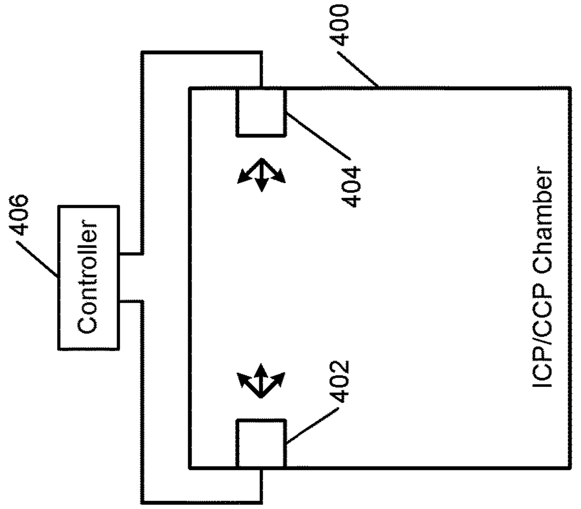
FIG. 5 shows an example of a light source arranged inside the process module according to the present disclosure.

In another example, the chamber 350 may include two viewing ports, and two light sources may be arranged outside the chamber 350 and proximate to the two viewing ports, respectively. In this example, both light sources may output only UV light or visible light. Alternatively, a first light source may output UV light while a second light source may output visible light. The controller 356 may turn on the two light sources together or in an alternating manner. The controller 356 may control the two light sources in a similar manner in which a controller 404 controls light sources 402 and 404, which are shown in FIG. 5 and which are described below with reference to FIG. 5.

Figure 4B:
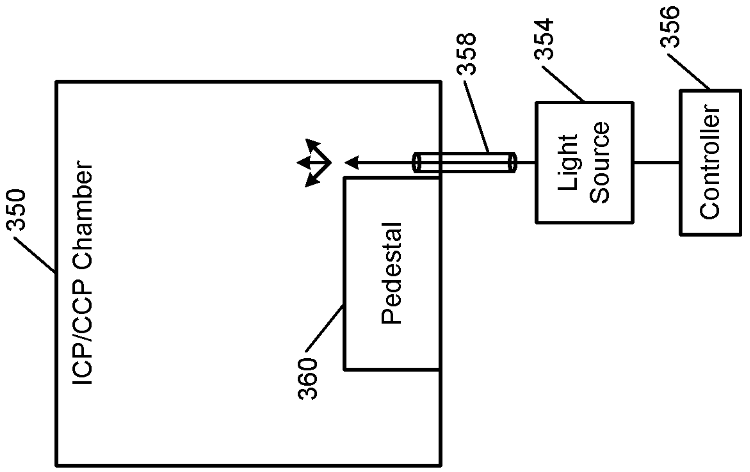
FIGS. 4A-4D show examples of various ways in which light can be introduced into a process module from a light source arranged outside the process module according to the present disclosure.

In FIG. 4B, when the process module does not include any viewing ports, the light source 354 may be arranged proximate to a bottom wall of the chamber 350. A conduit 358 in the bottom wall of the chamber 350 may allow the light output by the light source 354 to be introduced at a location around the perimeter or outer diameter (OD) of a pedestal 360 in the chamber 350. This way, the light from the light source 354 can be incident on most of the interior portion of the chamber 350. In some implementations, the light from the light source 354 may be introduced into the chamber 350 via optical fibers routed through the conduit 358 and arranged around the OD of the pedestal 360.

While only one light source 354 and only one conduit 358 are shown, two light sources outputting light of two different wavelengths and associated conduits may be used. In this example, the controller 356 may control the two light sources in a similar manner in which the controller 404 controls the light sources 402 and 404, which are shown in FIG. 5 and which are described below with reference to FIG. 5.

Figure 4A:
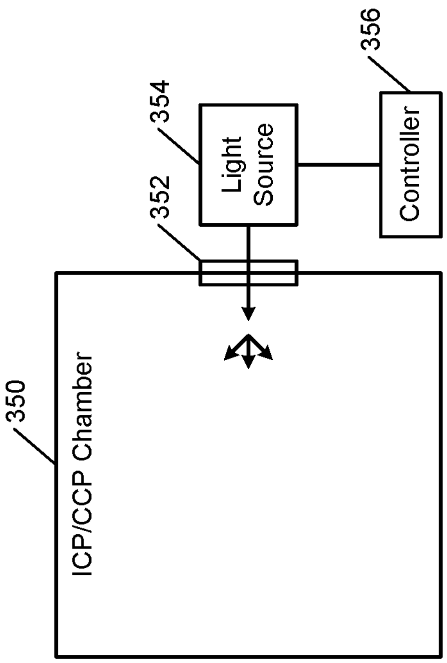
Figure 4C:
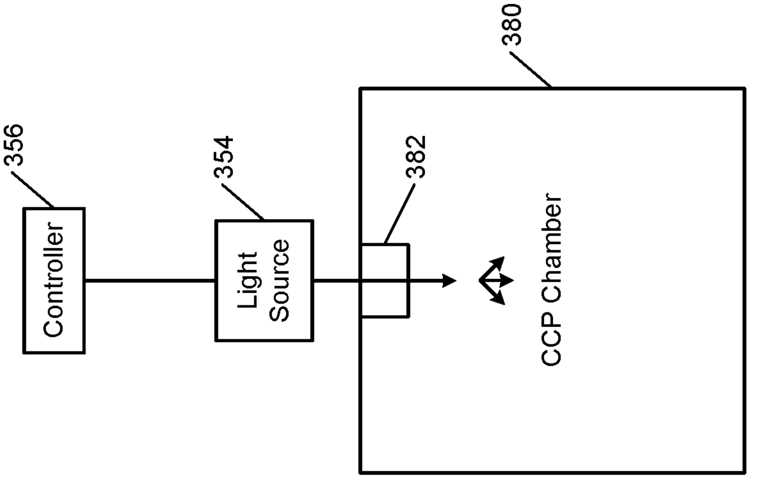

In FIG. 4C, a CCP chamber 380 (e.g., the processing chamber 102 shown in FIG. 1) may include a showerhead 382 (e.g., the showerhead 110 shown in FIG. 1). When the CCP chamber 380 does not include any viewing ports, the light from the light source 354 may be introduced into the CCP chamber 380 via the showerhead 382 (e.g., through gas flow introduction zone). For example, the light from the light source 354 may be introduced into the CCP chamber 380 via optical fibers routed through the showerhead 382 (e.g., through gas flow introduction zone).

Figure 4D:
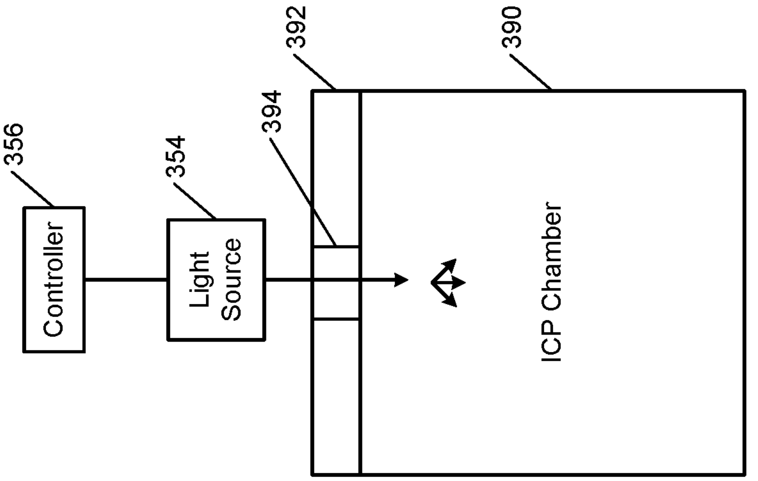

In FIG. 4D, an ICP chamber 390 (e.g., the processing chamber 228 shown in FIG. 2) may include a gas injector 392 (e.g., the gas injector 263 shown in FIG. 2). When the ICP chamber 390 does not include any viewing ports, the light from the light source 354 may be introduced into the ICP chamber 390 via the gas injector 392. For example, the light from the light source 354 may be introduced into the ICP chamber 390 via optical fibers routed through the gas injector 392.

In FIGS. 4A-4D, the controller 356 can turn on the light source 354 just before, at the same time, or shortly after the RF power is supplied to the chambers 350, 380, 390. The controller 356 can turn off the light source 354 after a short period while the RF power is still being supplied to the chambers 350, 380, 390. The controller 356 can turn off the light source 354 after the RF power supply to the chambers 350, 380, 390 is terminated. The controller 356 may keep the light source 354 turned on throughout the processing performed in the chambers 350, 380, 390.

In some examples, depending on the type of processing being performed in the chambers 350, 380, 390, the light source 354 may be turned on just before the RF power is supplied to the chambers 350, 380, 390 and may be turned off before the RF power supply to the chambers 350, 380, 390 is terminated. In some examples, the light source 354 may be turned on just before the RF power is supplied and may be turned off when the RF power is terminated. In some examples, the light source 354 may be turned on just before the RF power is supplied and may be turned off after the RF power is terminated.

In some examples, depending on the type of processing being performed in the chambers 350, 380, 390, the light source 354 may be turned on when the RF power is supplied to the chambers 350, 380, 390 and may be turned off before the RF power supply to the chambers 350, 380, 390 is terminated. In some examples, the light source 354 may be turned on when the RF power is supplied and may be turned off when the RF power is terminated. In some examples, the light source 354 may be turned on when the RF power is supplied and may be turned off after the RF power is terminated.

In some examples, depending on the type of processing being performed in the chambers 350, 380, 390, the light source 354 may be turned on after the RF power is supplied to the chambers 350, 380, 390 and may be turned off before the RF power supply to the chambers 350, 380, 390 is terminated. In some examples, the light source 354 may be turned on after the RF power is supplied and may be turned off when the RF power is terminated. In some examples, the light source 354 may be turned on after the RF power is supplied and may be turned off after the RF power is terminated.

In FIGS. 4A and 4B, if two light sources (e.g., first and second light sources) outputting light of two different wavelengths are used, both light sources may be turned on and off using similar timing sequences. In some examples, one light source may be kept turned on throughout the processing being performed in the chamber 350 while the other light source may be turned on and off using similar timing sequences. In some examples, both light sources may be kept turned on throughout the processing being performed in the chamber 350. In some examples, both light sources may be turned on and off as follows.

For example, both light sources may be turned on just before the RF power is supplied. In this example, both light sources may be turned off before, at the same time, or after the RF power is terminated. Alternatively, in this example, one light source may be turned off before the RF power is terminated while the other light source may be turned off when the RF power is terminated. Alternatively, in this example, one light source may be turned off before the RF power is terminated while the other light source may be turned off after the RF power is terminated.

For example, the first light source may be turned on just before the RF power is supplied while the second light source may be turned on when the RF power is supplied. In this example, both light sources may be turned off before, at the same time, or after the RF power is terminated. Alternatively, in this example, the first light source may be turned off before the RF power is terminated while the second light source may be turned off when the RF power is terminated. Alternatively, in this example, the first light source may be turned off before the RF power is terminated while the second light source may be turned off after the RF power is terminated.

For example, the first light source may be turned on when the RF power is supplied while the second light source may be turned on after the RF power is supplied. In this example, both light sources may be turned off before, at the same time, or after the RF power is terminated. Alternatively, in this example, the first light source may be turned off before the RF power is terminated while the second light source may be turned off when the RF power is terminated. Alternatively, in this example, the first light source may be turned off before the RF power is terminated while the second light source may be turned off after the RF power is terminated.

The light from the light source 354 (or light sources) incident on the internal components of the chambers 350, 380, 390 causes photoionization of negative ions adsorbed in outer surfaces of the internal components of the chambers 350, 380, 390 during processes performed in the chambers 350, 380, 390. The incident light can also cause photoionization of metal molecules in the outer surfaces of the internal components of the chambers 350, 380, 390. As a result, photoelectrons are ejected from the outer surface of the internal components of the chambers 350, 380, 390. These ejected photoelectrons impinge upon molecules and ions of gases that are being excited by the RF power to generate plasma, which accelerates plasma generation and reduces ignition time during plasma generation in the chambers 350, 380, 390.

FIG. 5 shows an ICP or CCP chamber 400 (such as the processing chambers 228 and 102 shown in FIGS. 1-2) that may not include a window or a viewing port. A light source 402 may be arranged inside the chamber 400. In some examples, multiple light sources may be arranged inside the chamber 400. For example, a second light source 404 may be arranged inside the chamber 400. The light sources 402, 404 may be arranged anywhere inside the chamber 400 such that light from light sources 402, 404 can be incident on maximum number of components of the chamber 400. For example, the light sources 402, 404 may be arranged at locations inside the chamber 400 such that they are not in the path of, and therefore do not interfere with, the processing performed in the chamber 400. Such arrangement of the light sources 402, 404 also reduces effects of process chemistries on the light sources 402, 404 while allowing purge gases to purge any coating formed by the process chemistries on the material encapsulating the light sources 402, 404.

A controller 406 (e.g., the controller 160 or 254 shown in FIGS. 1-2) may control the light sources 402, 404. The controller 406 controls an RF source (e.g., the RF generator 122 and the RF sources 212 shown in FIGS. 1-2) that supplies RF power to the chamber 400 and controls the light sources 402, 404 synchronously with the RF power supplied by the RF source to the chamber 400. For example, when only one light source (e.g., the light source 402) is used, the light source 402 may output only ultraviolet light. In some examples, the light source 402 may output visible light. In other examples, the light source 402 may output light of different wavelengths, and the controller 406 may control the wavelength of the light output by the light source 402.

In some examples, when multiple light sources (e.g., the light sources 402, 404) are used, one light source (e.g., the light source 402) may output only UV light while the other light source (e.g., the light source 404) may output visible light. The controller 406 can turn each of the light sources 402, 404 on and off individually. The controller 406 can also control the duty cycle of each of the light sources 402, 404 individually. The controller 406 can also turn the light sources 402, 404 on or off at the same time or in an alternating manner.

The controller 406 can turn on the light sources 402, 404 just before, at the same time, or shortly after the RF power is supplied to the chamber 400. The controller 406 can turn off the light sources 402, 404 after a short period while the RF power is still being supplied to the chamber 400. The controller 406 can turn off the light sources 402, 404 after the RF power supply to the chamber 400 is terminated. The controller 406 may keep the light sources 402, 404 turned on throughout the processing performed in the chamber 400.

In some examples, depending on the type of processing being performed in the chamber 400, the light source 402 outputting light of a first wavelength may be kept turned on throughout the processing performed in the chamber 400, while the light source 404 outputting light of a second wavelength may be turned on just before, at the same time, or shortly after the RF power is supplied to the chamber 400 as follows.

In some examples, depending on the type of processing being performed in the chamber 400, the light source 404 may be turned on just before the RF power is supplied to the chamber 400 and may be turned off before the RF power supply to the chamber 400 is terminated. In some examples, the light source 404 may be turned on just before the RF power is supplied and may be turned off when the RF power is terminated. In some examples, the light source 404 may be turned on just before the RF power is supplied and may be turned off after the RF power is terminated.

In some examples, depending on the type of processing being performed in the chamber 400, the light source 404 may be turned on when the RF power is supplied to the chamber 400 and may be turned off before the RF power supply to the chamber 400 is terminated. In some examples, the light source 404 may be turned on when the RF power is supplied and may be turned off when the RF power is terminated. In some examples, the light source 404 may be turned on when the RF power is supplied and may be turned off after the RF power is terminated.

In some examples, depending on the type of processing being performed in the chamber 400, the light source 404 may be turned on after the RF power is supplied to the chamber 400 and may be turned off before the RF power supply to the chamber 400 is terminated. In some examples, the light source 404 may be turned on after the RF power is supplied and may be turned off when the RF power is terminated. In some examples, the light source 404 may be turned on after the RF power is supplied and may be turned off after the RF power is terminated.

In some examples, both the light sources 402 and 404 may be turned on and off using similar timing sequences as follows. For example, both light the light sources 402 and 404 may be turned on just before the RF power is supplied. In this example, both the light sources 402 and 404 may be turned off before, at the same time, or after the RF power is terminated. Alternatively, in this example, the light source 402 may be turned off before the RF power is terminated while the light source 404 may be turned off when the RF power is terminated. Alternatively, in this example, the light source 402 may be turned off before the RF power is terminated while the light source 404 may be turned off after the RF power is terminated.

For example, the light source 402 may be turned on just before the RF power is supplied while the light source 404 may be turned on when the RF power is supplied. In this example, both the light sources 402 and 404 may be turned off before, at the same time, or after the RF power is terminated. Alternatively, in this example, the light source 402 may be turned off before the RF power is terminated while the light source 404 may be turned off when the RF power is terminated. Alternatively, in this example, the light source 402 may be turned off before the RF power is terminated while the light source 404 may be turned off after the RF power is terminated.

For example, the light source 402 may be turned on when the RF power is supplied while the light source 404 may be turned on after the RF power is supplied. In this example, both the light sources 402 and 404 may be turned off before, at the same time, or after the RF power is terminated. Alternatively, in this example, the light source 402 may be turned off before the RF power is terminated while the light source 404 may be turned off when the RF power is terminated. Alternatively, in this example, the light source 402 may be turned off before the RF power is terminated while the light source 404 may be turned off after the RF power is terminated.

The light from the light source 403 (or light sources 402, 404) incident on the internal components of the chamber 400 causes photoionization of negative ions adsorbed in outer surfaces of the internal components of the chamber 400 during processes performed in the chamber 400. The incident light can also cause photoionization of metal molecules in the outer surfaces of the internal components of the chamber 400. As a result, photoelectrons are ejected from the outer surface of the internal components of the chamber 400. These ejected photoelectrons impinge upon molecules and ions of gases that are being excited by the RF power to generate plasma, which accelerates plasma generation and reduces ignition time during plasma generation in the chamber 400.

In the examples described above, the light source (or light sources) can be pulsed to eject photoelectrons in bursts (offering a much higher current) to ignite the plasma. For example, the controllers can control the light sources to output light pulses synchronously with the supply of RF power in various ways described above. For example, the controllers can control the light sources to output light pulses independently of the supply of RF power. The duration (i.e., pulse width) and/or the pulse repetition rate of the light pulses can be varied depending on the chemistry (i.e., the gas or gases) used to generate the plasma.

Figure 6:
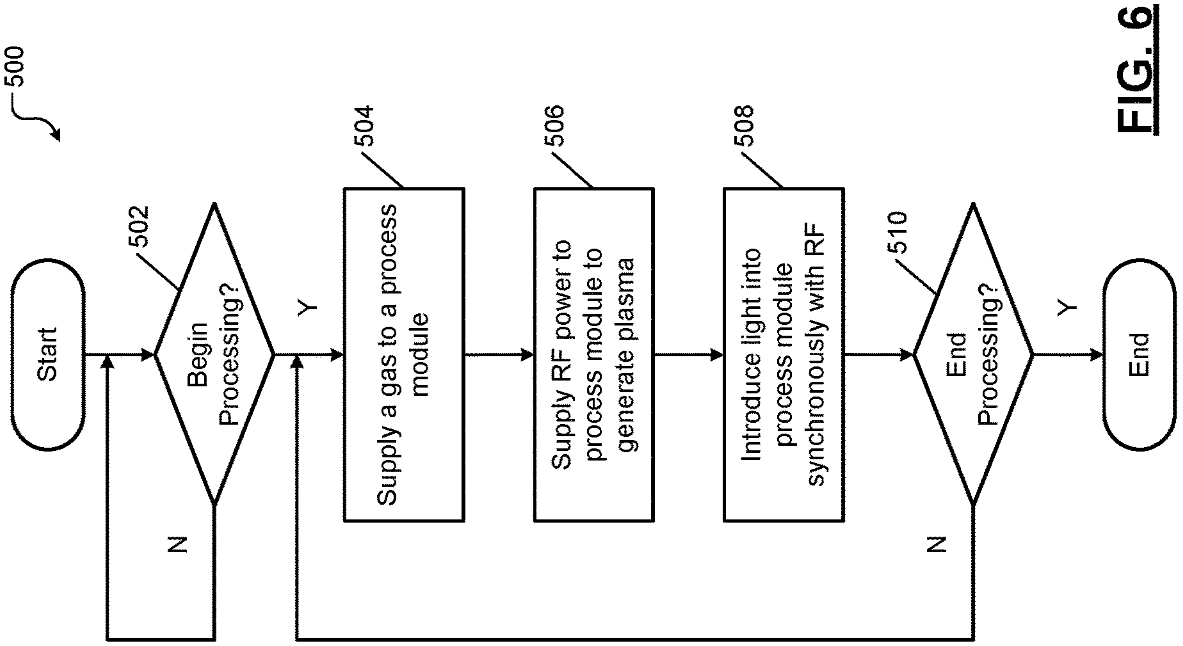
FIG. 6 shows a method of performing photoelectron assisted plasma ignition according to the present disclosure.

FIG. 6 shows a method 500 for performing photoelectron assisted plasma ignition according to the present disclosure. For example, any of the controllers shown in FIGS. 1-5 may perform the method 500 in any of the chambers or process modules shown in FIGS. 1-5. At 502, the method 500 determines whether to begin processing in a process module (e.g., whether to process a wafer in the process module or clean the process module). The method 500 waits until the processing begins.

At 504, if the processing begins (e.g., if plasma is to be generated), the method 500 supplies a gas to the process module (e.g., a precursor, a process gas, or a cleaning gas depending on the processing being performed in the process module). At 506, the method 500 supplies RF power to the process module to generate plasma in the process module. At 508, using a light source arranged outside or inside the process module, the method 500 introduces light (e.g., UV and/or visible light) from the light source into the process module synchronously with the supply of the RF power to the process module. For example, the method 500 can turn on the light source shortly after the RF power is supplied to the process module and can turn off the light source after a short period while the RF power is still being supplied to the process module.

At 510, the method 500 determines whether to end the processing in the process module (e.g., if the plasma is to be extinguished). The method 500 returns to 504 if the processing in the process module is to be continued. The method 500 ends if the processing in the process module is to be terminated.

The teachings of the present disclosure are not limited generating plasma in processing modules during deposition, etching, or chamber cleaning. The teachings can also be applied to chambers that generate plasma remotely from a process module and supply the remote plasma to the process module. For example, the remote plasma is typically generated using an ICP chamber. All of the teachings described above with reference to ICP chambers are applicable to such ICP chambers used to generate the remote plasma.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:

a gas source to supply a first gas to a process module of the substrate processing system;

an RF source to supply RF power to the process module to generate plasma when the first gas is supplied to the process module of the substrate processing system;

a substrate arranged in the process module to be processed by the plasma;

a light source coupled to the process module using a mounting assembly to introduce light having a first wavelength into the process module and configured to irradiate an internal component of the process module other than the substrate during the plasma generation;

a second light source to introduce light having a second wavelength into the process module synchronously with the supply of the RF power during the plasma generation and configured to irradiate the internal component of the process module during the plasma generation; and a controller to select the second light source in response to the gas source supplying a second gas to the process module instead of the first gas, wherein the second gas is different than the first gas.

2. The substrate processing system of claim 1 wherein the light source is coupled to the process module to introduce light into the process module synchronously with the supply of the RF power to the process module during the plasma generation.

3. The substrate processing system of claim 1 wherein the controller is configured to control the RF source and the light source and to synchronize the introduction of the light from the light source into the process module with the supply of the RF power from the RF source to the process module during the plasma generation.

4. The substrate processing system of claim 1 wherein:

the light generated by the light source includes only ultraviolet light or only visible light.

5. The substrate processing system of claim 1 wherein the light source is configured to output light having different wavelengths, and wherein the controller is configured to select the first wavelength of the light output by the light source based on the first gas.

6. The substrate processing system of claim 1 wherein the light source is external to the process module and is arranged proximate to a viewing port of the process module.

7. The substrate processing system of claim 1 wherein the light source is arranged inside the process module and wherein the light source is encapsulated with a material other than glass.

8. The substrate processing system of claim 1 wherein the process module includes a dielectric window and the light source includes light emitting diodes disposed in the dielectric window.

9. The substrate processing system of claim 8 wherein the light emitting diodes output ultraviolet light, visible light, or light having different wavelengths comprising the first wavelength.

10. The substrate processing system of claim 8 wherein the controller is configured to turn the light emitting diodes on and off individually.

11. The substrate processing system of claim 8 wherein the controller is configured to turn the light emitting diodes on and off in a pattern.

12. The substrate processing system of claim 8 wherein the controller is configured to control wavelengths of light output by the light emitting diodes individually.

13. The substrate processing system of claim 1 wherein the light source is external to the process module and the light from the light source is introduced into the process module using optical fibers.

14. The substrate processing system of claim 13 wherein the process module includes a showerhead and the optical fibers are routed through the showerhead.

15. The substrate processing system of claim 13 wherein the process module includes a dielectric window and a gas injector arranged therein and wherein the optical fibers are routed through the gas injector.

16. The substrate processing system of claim 13 wherein the process module includes a pedestal and the optical fibers are routed from under the process module at a location outside a perimeter of the pedestal.

17. The substrate processing system of claim 1 wherein the controller is configured to control the light source to generate the light as light pulses and to introduce the light pulses into the process module during the plasma generation.

18. The substrate processing system of claim 17 wherein the controller selects at least one of a pulse width and a pulse repetition rate of the light pulses based on the first gas.

19. The substrate processing system of claim 1 wherein: the process module is configured to generate inductively coupled plasma or a capacitively coupled plasma.

* * * * *